(12) United States Patent
Shin et al.

(10) Patent No.: US 9,905,422 B2
(45) Date of Patent: Feb. 27, 2018

(54) TWO-DIMENSIONAL MATERIAL HARD MASK, METHOD OF MANUFACTURING THE SAME, AND METHOD OF FORMING MATERIAL LAYER PATTERN USING THE HARD MASK

(71) Applicant: Samsung Electronics Co., Ltd., Suwon-si, Gyeonggi-do (KR)

(72) Inventors: Keunwook Shin, Yongin-si (KR); Minsu Seol, Suwon-si (KR); Hyeonjin Shin, Suwon-si (KR); Sangwon Kim, Seoul (KR); Seongjun Park, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/984,189

(22) Filed: Dec. 30, 2015

(65) Prior Publication Data

US 2017/0025273 A1   Jan. 26, 2017

(30) Foreign Application Priority Data

Jul. 24, 2015 (KR) .......................... 10-2015-0105075

(51) Int. Cl.
  *H01L 21/027* (2006.01)
  *H01L 21/033* (2006.01)
  *H01L 21/02* (2006.01)

(52) U.S. Cl.
  CPC .... *H01L 21/0332* (2013.01); *H01L 21/02118* (2013.01); *H01L 21/02274* (2013.01)

(58) Field of Classification Search
  CPC .................................................. H01L 21/0332
  See application file for complete search history.

(56) References Cited

U.S. PATENT DOCUMENTS

| | | | |
|---|---|---|---|
| 7,718,081 B2 | 5/2010 | Liu et al. | |
| 8,263,321 B2 | 9/2012 | Yoon et al. | |
| 8,273,519 B2 | 9/2012 | Kim et al. | |
| 2014/0191400 A1 | 7/2014 | Chien et al. | |
| 2015/0377824 A1* | 12/2015 | Ruhl | G01N 33/004 204/424 |
| 2016/0027645 A1* | 1/2016 | Shin | H01L 21/0332 438/703 |
| 2016/0291472 A1* | 10/2016 | Shin | G03F 7/094 |

FOREIGN PATENT DOCUMENTS

| | | | |
|---|---|---|---|
| KR | 20120073819 A | | 7/2012 |
| KR | 101507065 B1 | | 3/2015 |
| WO | WO2011094597 | * | 8/2011 |

* cited by examiner

*Primary Examiner* — Kathleen Duda
(74) *Attorney, Agent, or Firm* — Harness, Dickey & Pierce, P.L.C.

(57) ABSTRACT

A 2D material hard mask includes hydrogen, oxygen, and a 2D material layer having a layered crystalline structure. The 2D material layer may be a material layer including one of a carbon structure (for example, a graphene sheet) and a non-carbon structure.

8 Claims, 7 Drawing Sheets

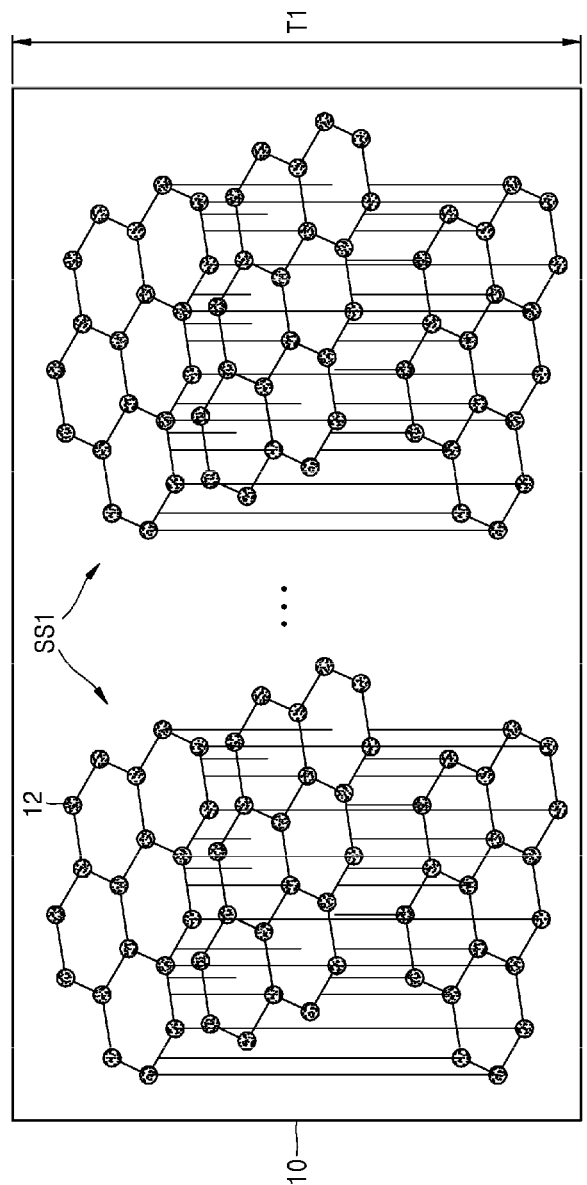

TWO-DIMENSIONAL MATERIAL HARD MASK, METHOD OF MANUFACTURING THE SAME, AND METHOD OF FORMING MATERIAL LAYER PATTERN USING THE HARD MASK

CROSS-REFERENCE TO RELATED APPLICATION

This application claims the benefit of Korean Patent Application No. 10-2015-0105075, filed on Jul. 24, 2015, in the Korean Intellectual Property Office, the disclosure of which is incorporated herein in its entirety by reference.

BACKGROUND

1. Field

Example embodiments relate to masks for manufacturing electronic devices, and more particularly, two-dimensional material hard masks, methods of manufacturing the same, and methods of forming a material layer pattern using the same.

2. Description of the Related Art

As the techniques of manufacturing semiconductor devices have improved, the integration density of the semiconductor devices has been increased, and accordingly, the size of semiconductor devices has been further reduced. As the size of semiconductor devices is reduced, the wavelength of light used for exposure is reduced. As the size of the semiconductor devices is reduced, the thickness of a photoresist film used as a mask is also reduced. Accordingly, correctly realizing a vertical profile may be difficult. For this reason, currently, an amorphous carbon layer (ACL) is used as a hard mask. However, although the ACL is used, correctly forming a pattern having a desired profile may be difficult due to a relatively large aspect ratio of semiconductor devices of a reduced size, and also, a pattern defect, e.g., leaning or wiggling, may occur.

SUMMARY

Example embodiments relate to two-dimensional (2D) material hard masks having a relatively high etch resistance, and thus, having a relatively high etch selectivity.

Example embodiments relate to methods of manufacturing a 2D material hard mask having a layered crystalline structure.

Example embodiments relate to methods of forming a material layer pattern that may be used to form a desired profile pattern.

Additional example embodiments will be set forth in part in the description which follows and, in part, will be apparent from the description, or may be learned by practice of the example embodiments.

According to example embodiments, a hard mask includes hydrogen, oxygen and a two-dimensional (2D) material layer having a layered crystalline structure.

The content of the oxygen may be 4 atomic % or less, a density of the hard mask may be in a range from about 2.0 g/cm$^3$ to about 2.2 g/cm$^3$, and the content of the hydrogen may be 10 atomic % or less.

The 2D material layer may have one of a carbon structure and a non-carbon structure. The 2D material layer may be the carbon structure including a plurality of graphene sheets.

The 2D material layer may be a carbon containing material layer having a higher sp2 carbon ratio than an sp carbon ratio.

The 2D material layer may further include a doped impurity.

The 2D material layer may include a plurality of graphene sheets.

According to example embodiments, a method of forming a hard mask includes loading a substrate in a material layer deposition apparatus; and depositing a hard mask material on the substrate by supplying a source gas into the material layer deposition apparatus, the hard mask material including a two-dimensional (2D) material.

The substrate may include one of a monolayer substrate and a multi-layer substrate.

The 2D material may have one of a carbon structure and a non-carbon structure.

The hard mask material may have a thickness in a range from about 5 nm to about 200 nm.

The method may further include supplying a doping impurity together with the source gas to the material layer deposition apparatus.

After completing the depositing of the hard mask material, the method may further include unloading the substrate from the material layer deposition apparatus, and, after unloading the substrate, doping an impurity into the deposited hard mask material.

The source gas may include one of a first source gas including carbon and a second source gas not including carbon. The first source gas may be one of a first gas including carbon and hydrogen, a second gas including carbon, hydrogen and another component, and a third gas including a ring type carbon gas.

The first gas may include one of $CH_4$, $C_2H_2$, and $C_3H_8$, the second gas may include one of $SiH_3CH_3$ and $C_2H_8N_2$, and the third gas may include one of benzene, xylene, and pyrene.

The material layer deposition apparatus may be a chemical vapor deposition (CVD) apparatus.

According to example embodiments, a method of forming a material layer pattern includes forming a material layer on a substrate, forming the hard mask of example embodiments on the material layer, patterning the hard mask to expose a portion of the material layer, and etching the exposed portion of the material layer.

The patterning of the hard mask may include forming a photosensitive film on the hard mask, patterning the photosensitive film to expose a portion of the hard mask, etching the exposed portion of the hard mask, and removing the photosensitive film.

BRIEF DESCRIPTION OF THE DRAWINGS

These and/or other example embodiments will become apparent and more readily appreciated from the following description taken in conjunction with the accompanying drawings in which:

FIG. 1 is a schematic drawing showing a two-dimensional (2D) material hard mask and a layer structure of an internal unit composite, according to example embodiments;

DETAILED DESCRIPTION

Figure 2A:
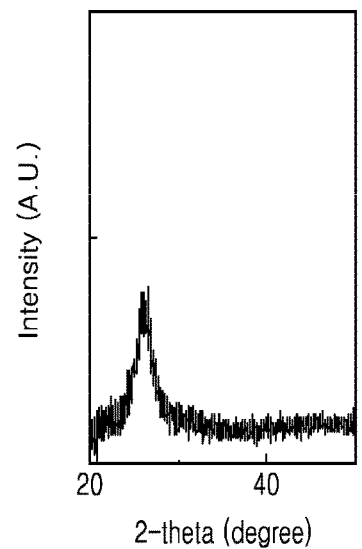
FIGS. 2(a) and 3(a) are graphs of an analysis result of X-ray diffraction (XRD) with respect to a 2D material hard mask according to example embodiments.

A two-dimensional (2D) material hard mask, a method of manufacturing the 2D material hard mask, and a method of manufacturing a material layer pattern using the 2D material hard mask will now be made in detail to example embodiments, examples of which are illustrated in the accompanying drawings. In the drawings, the sizes or thicknesses of constituent elements are exaggerated for clarity.

It will be understood that when an element is referred to as being "on," "connected" or "coupled" to another element, it can be directly on, connected or coupled to the other element or intervening elements may be present. In contrast, when an element is referred to as being "directly on," "directly connected" or "directly coupled" to another element, there are no intervening elements present. As used herein the term "and/or" includes any and all combinations of one or more of the associated listed items. Further, it will be understood that when a layer is referred to as being "under" another layer, it can be directly under or one or more intervening layers may also be present. In addition, it will also be understood that when a layer is referred to as being "between" two layers, it can be the only layer between the two layers, or one or more intervening layers may also be present.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

In the drawing figures, the dimensions of layers and regions may be exaggerated for clarity of illustration. Like reference numerals refer to like elements throughout. The same reference numbers indicate the same components throughout the specification.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein. As used herein, expressions such as "at least one of," when preceding a list of elements, modify the entire list of elements and do not modify the individual elements of the list.

When the terms "about" or "substantially" are used in this specification in connection with a numerical value, it is intended that the associated numerical value include a tolerance of ±10% around the stated numerical value. Moreover, when reference is made to percentages in this specification, it is intended that those percentages are based on weight, i.e., weight percentages. The expression "up to" includes amounts of zero to the expressed upper limit and all values therebetween. When ranges are specified, the range includes all values therebetween such as increments of 0.1%. Moreover, when the words "generally" and "substantially" are used in connection with geometric shapes, it is intended that precision of the geometric shape is not required but that latitude for the shape is within the scope of the disclosure. Although the tubular elements of the embodiments may be cylindrical, other tubular cross-sectional forms are contemplated, such as square, rectangular, oval, triangular and others.

FIG. 1 is a schematic drawing showing a hard mask (hereinafter, a 2D material hard mask 10) formed of a 2D material (or including a 2D material) and a layer structure of internal composite, according to example embodiments.

Referring to FIG. 1, in the 2D material hard mask 10, elements 12 may form a layered structure. The 2D material hard mask 10 may be a 2D material layer having a crystal structure. Unit composite structures SS1 are included in the 2D material layer that constitutes the 2D material hard mask 10. The 2D material layer, that is, the 2D material hard mask 10, is formed by repeating the unit composite structure SS1. In the layered structure of the unit composite structure SS1, each layer may be a 2D material sheet. Each of the unit composite structures SS1 includes a plurality of the elements 12. The unit composite structure SS1 may include one component elements or more than two component elements according to the type of 2D material. If the unit composite structure SS1 includes one component element, the elements 12 of the unit composite structure SS1 may be, for example, carbons having a double bond. Binding energy of carbons having a double bond is greater than that of carbons having a single bond. For example, the binding energy of carbons having a single bond is in a range from about 347 kJ/mol to about 356 kJ/mol. However, the binding energy of carbons having a double bond is in a range from about 611 kJ/mol to about 632 kJ/mol. Accordingly, the etch resistance of the 2D material hard mask 10 according to example embodiments may be greater than a hard mask formed of carbons having a single bond.

When the elements 12 of the unit composite structure SS1 are carbons having a double bond, the unit composite structure SS1 may be a layer structure in which a plurality of graphene sheets are stacked, and the 2D material hard mask 10 may have a layer structure in which a plurality of graphene sheets are stacked. The unit composite structure SS1 may be a structure that has an interlayer crystal structure but does not include carbons (hereinafter, a non-carbon structure). In this case, the unit composite structure SS1 may include two or more component elements that are different from each other as main components. A 2D material having a layered structure and non-carbon structure may be, for example, h-BN, $MoS_2$, $MoSe_2$, $WS_2$, or $WSe_2$.

The 2D material hard mask 10 may further include hydrogen, oxygen or a side component element besides the main component elements, or may further include a doped impurity, e.g., boron or nitrogen. The content of hydrogen or oxygen included in the 2D material hard mask 10 is relatively small when compared to the content of the main component elements, or may be a negligible amount. The hydrogen content included in the 2D material hard mask 10 may be 10 atomic % or less, for example, 7 atomic % or less. The oxygen content included in the 2D material hard mask 10 may be 4 atomic % or less, for example, 1.0 atomic % or less. The 2D material hard mask 10 may have a density greater than that of a hard mask, for example, an ACL hard mask of the related art. The density of the 2D material hard mask 10 may be 2.0 g/cm$^3$ or more, for example, in a range from 2.0 g/cm$^3$ to 2.2 g/cm$^3$. When the 2D material hard mask 10 includes a doped impurity, the doping amount may be, for example, 0.1% to 50%.

When the 2D material hard mask 10 is a 2D material layer that uses carbon as the main component, the SP2 carbon ratio is greater than the SP3 carbon ratio in the 2D material hard mask 10. For example, in the 2D material hard mask 10, the SP2 carbon ratio may from one time to ten times greater than the SP3 carbon ratio. The 2D material hard mask 10 may have a predetermined or given thickness T1, for example, in a range from 5 nm to 200 nm. However, the thickness T1 of the 2D material hard mask 10 is not limited thereto, that is, the thickness T1 of the 2D material hard mask 10 may vary according to the material characteristic of a material layer to be etched.

Figure 2B:
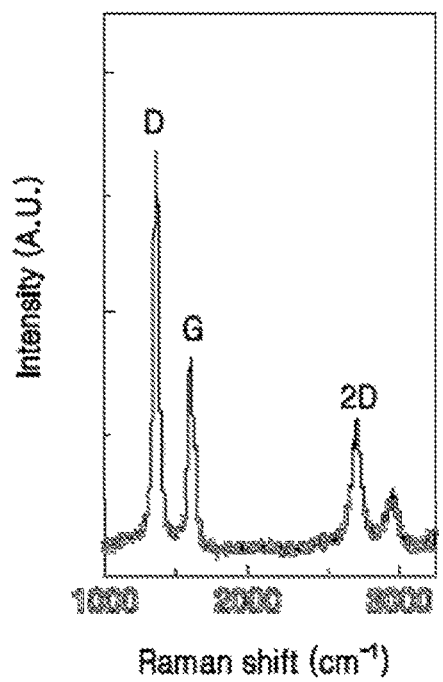
FIGS. 2(b) and 3(b) are graphs of a measuring result using Raman spectroscope with respect to a 2D material hard mask according to example embodiments.
Figure 3A:
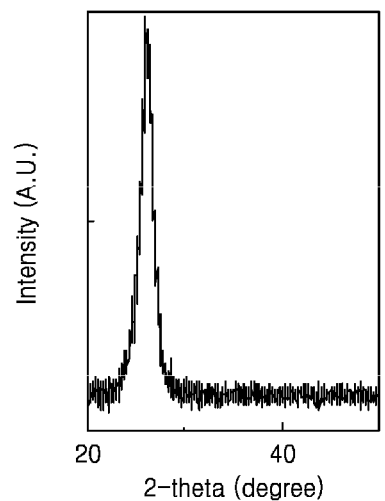
Figure 3B:
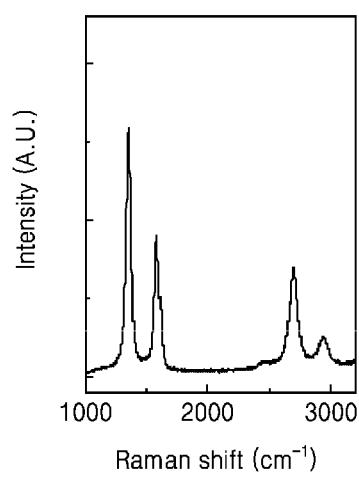

FIGS. 2(a) and 3(a) are graphs of an analysis result of X-ray diffraction (XRD) with respect to a 2D material hard mask according to example embodiments, and FIGS. 2(b) and 3(b) are graphs of a measuring result using Raman spectroscope with respect to a 2D material hard mask according to example embodiments.

In (a) of FIGS. 2 and 3, the horizontal axis indicates a diffraction angle and the vertical axis indicates the intensity of diffracted x-ray. In (b) of FIGS. 2 and 3, the horizontal axis indicates a Raman shift (cm$^{-1}$) and the vertical axis indicates the intensity of peaks.

The graph of FIG. 2 is the result of XRD with respect to a hard mask formed at a temperature of 800° C. in a method of manufacturing the hard mask, and the graph of FIG. 3 is the result of Raman shift with respect to a hard mask formed at a temperature of 750° C. in a method of manufacturing a hard mask described below.

When the graphs of FIGS. 2 and 3 are compared, although the intensities of the peaks are different, both the diffraction peak pattern and the Raman spectroscope peak pattern are the same. Also, referring to the measurement results (b) of the Raman spectroscope of FIGS. 2 and 3, the ratio (ID/IG) of the intensity of a G band (G) with respect to the intensity of a D band (D) is greater than 1, and the ratio (I2D/IG) of the intensity of the G band (G) with respect to the intensity of a 2D band (2D) is smaller than 1. The diffraction peak pattern and the Raman spectroscope peak pattern that are seen in FIGS. 2 and 3 may not be seen when the 2D material hard mask 10 is amorphous, but may be seen when the 2D material hard mask 10 is graphite having a crystal structure. Accordingly, the results of FIGS. 2 and 3 show that the 2D material hard mask 10 according to example embodiments is not amorphous but is a carbon structure (for example, graphene) having a crystal structure.

A method of manufacturing the 2D material hard mask 10 according to example embodiments will be described with reference to FIG. 4

Figure 4:
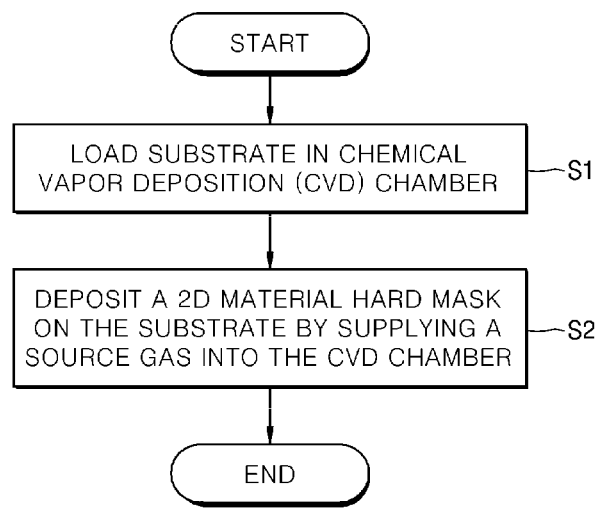
FIG. 4 is flow chart of a method of manufacturing a 2D material hard mask according to example embodiments.

FIG. 4 is flow chart of a method of manufacturing a 2D material hard mask 10 according to example embodiments.

Referring to FIG. 4, a substrate on which a 2D material hard mask is formed is loaded or placed in a reactor of a chemical vapor deposition (CVD) apparatus (51). The CVD apparatus may be, for example, a plasma enhanced CVD (PECVD) apparatus, but is not limited thereto. A 2D material hard mask is formed on the substrate by supplying a source gas for forming the 2D material hard mask in the reactor (S2). The temperature of the reactor may be in a range from about 400° C. to about 1,000° C., and the process pressure may be in a range from about 5 mtorr to about 200 mtorr.

In S2, a predetermined or given doping impurity (for example, boron or nitrogen) may be supplied to the reactor together with the source gas. In this manner, a 2D material hard mask doped with an impurity may be formed. Instead of doping the impurity in a CVD process, after forming the hard mask by using the CVD method, an additional doping process may be performed with respect to the formed hard mask. The substrate may be a silicon substrate. Also, the substrate may include a material layer stacked on the silicon substrate. The stacked material layer may include a mono-material layer or a plurality of material layers. The mono-material layer may include a conductive layer, an insulating layer, or a semiconductor layer. The plurality of material layers may include one of a conductive layer, an insulating layer, and a semiconductor layer. The stacked material layer may have a stack structure that constitutes a device.

The source gas may be a first source gas that includes carbon, or a second source gas that does not include carbon. When the source gas is the first source gas, a carbon structure (for example, a graphene sheet) having a crystal structure may be stacked on the substrate, and as a result, a hard mask that is a crystal structure and includes a stacked carbon structure may be formed on the substrate. When the source gas is the second source gas, a 2D material layer that is a non-carbon structure and has a crystal structure may be stacked on the substrate, and as a result, a hard mask that is a crystal structure and includes a 2D material that does not include carbon may be formed on the substrate.

The first source gas may include a first gas that includes carbon and hydrogen, a second gas that includes carbon, hydrogen and another component, and a third gas that includes a ring type carbon gas. The first gas may include, for example, $CH_4$, $C_2H_2$, or $C_3H_8$. The second gas may include, for example, $SiH_3CH_3$ or $C_2H_8N_2$. The third gas may include benzene, xylene, or pyrene.

Test results of the 2D material hard mask 10 with respect to the content of oxygen and hydrogen, density, and etch-resistance characteristic will be described.

The test results are obtained using a first hard mask and a second hard mask each formed of a 2D material. The first and second hard masks are formed by using the same method as used to form the 2D material hard mask 10 according to example embodiments. The first hard mask is formed by using the CVD method at a process temperature of 800° C., and the second hard mask is formed at another temperature of, for example, 750° C.

In the test, an amorphous carbon layer (ACL) (hereinafter, a third hard mask) is formed to compare it with the first hard mask and the second hard mask, and the contents of hydrogen and oxygen, density, and an etch characteristic of the ACL are measured. The third hard mask is formed by using a spin coating method. In the test, the first through third hard masks have the same thickness.

Table 1 summarizes the contents of hydrogen and oxygen, density, and etch characteristic of the first through third hard masks.

TABLE 1

| Items | Content (atomic %) | | Density ($g/cm^3$) |
|---|---|---|---|
| | Hydrogen (H) | Oxygen (O) | |
| First hard mask | 6.4 | ≤1.0 | 2.00 |
| Second hard mask | 6.0 | 1.0 | 2.05 |
| Third hard mask (ACL) | 23.6 | 4.0 | 1.60 |

Referring to Table 1, the first and second hard masks show relatively few differences in the content of hydrogen and oxygen, the density, and the etch characteristic.

However, the third hard mask shows a relatively large difference in the content of hydrogen and oxygen, density, and etch characteristic with respect to the first hard mask and the second hard mask. The etch resistance and the etch selectivity of a hard mask increase as the content of hydrogen and oxygen becomes lower and the density becomes higher. Accordingly, the result of Table 1 indicates that the etch resistance and the etch selectivity of the first and second hard masks are improved when compare with the third hard mask, that is, a conventional hard mask. Therefore, when a hard mask according to example embodiments is used, a desired pattern may be correctly transferred to a structure or a material layer that is to be etched and has a relatively large aspect ratio.

Table 2 shows etch resistance characteristics of the first through third hard masks.

TABLE 2

| Items | Etching rate (ER)(nm/s) | Relative etching rate to ACL (%) |
|---|---|---|
| First hard mask | 0.58 | 7.64 |
| Second hard mask | 0.472 | 24.84 |
| Third hard mask (ACL) | 0.628 | 0 |

Referring to Table 2, the etching rates of the first and second hard masks (respectively having etching rates of 0.58 nm/s and 0.472 nm/s) are less than the etching rate (0.628 nm/s) of the third hard mask (ACL). The etching rate of the first hard mask is less than that of the third hard mask by about 7.64%, and the etching rate of the second hard mask is less than that of the third hard mask by about 24.84%. The relatively low etching rate denotes that the etch resistance and the etch selectivity are relatively high, and thus, the results of Table 2 show that the etch resistance and the etch selectivity of the first hard mask and the second hard mask, that is, the 2D material hard mask 10 according to example embodiments, are improved when compared with the third hard mask.

A method of patterning a material layer to which the 2D material hard mask 10 according to example embodiments is applied will be described with reference to FIGS. 5 through 10.

Figure 5:
FIGS. 5 through 10 are cross-sectional views for explaining a method of manufacturing a material layer pattern using a 2D material hard mask according to example embodiments.

Referring to FIG. 5, a material layer 32 is formed on a substrate 30. The material layer 32 may be a monolayer or a composite layer including a plurality of layers. The material layer 32 may be the uppermost layer of a layer structure that includes a device (for example, a capacitor, a transistor, or an optical device). A hard mask 34 is formed on the material layer 32. The hard mask 34 may be the 2D material hard mask 10 (refer to FIG. 1). A photosensitive film 36 is formed on the hard mask 34. The photosensitive film 36 may be, for example, a photoresist. A material layer (not shown), such as a reflection inhibition layer, may further be formed between the hard mask 34 and the photosensitive film 36. The material layer (not shown) may be removed together with the photosensitive film 36.

Figure 6:
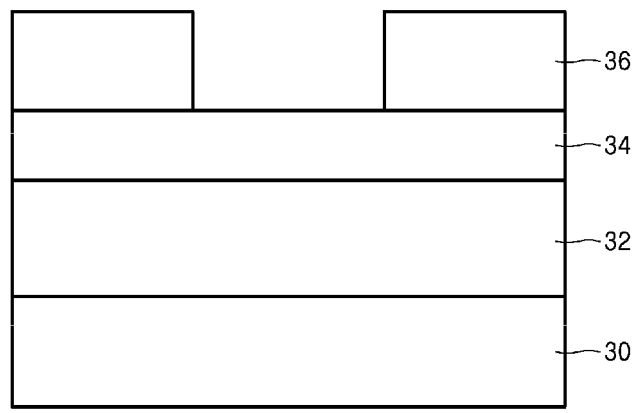

As depicted in FIG. 6, a portion of the hard mask 34 is exposed by removing a portion of the photosensitive film 36. The process for removing the photosensitive film 36 may be performed by using a photolithography process.

Figure 7:
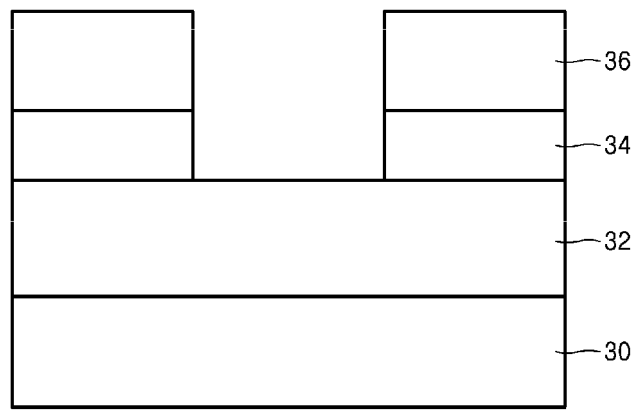
Figure 8:
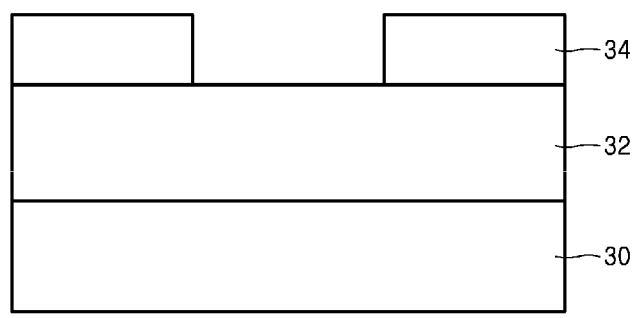

As depicted in FIG. 7, the exposed portion of the hard mask 34 is etched by using the photosensitive film 36 as an etch mask. At this point, the etching may continue until the material layer 32 is exposed. As a result of the etching, the pattern of the photosensitive film 36 may be transmitted to the hard mask 34. Afterwards, the photosensitive film 36 is removed. When a material layer (for example, a reflection inhibition layer) exists between the photosensitive film 36 and the hard mask 34, the material layer may be removed together with the photosensitive film 36. FIG. 8 shows a resultant product after removing the photosensitive film 36.

Figure 9:
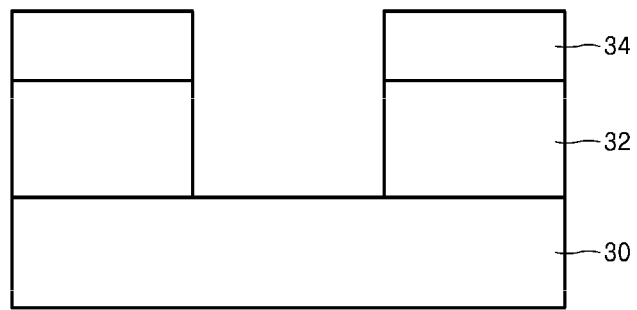
Figure 10:
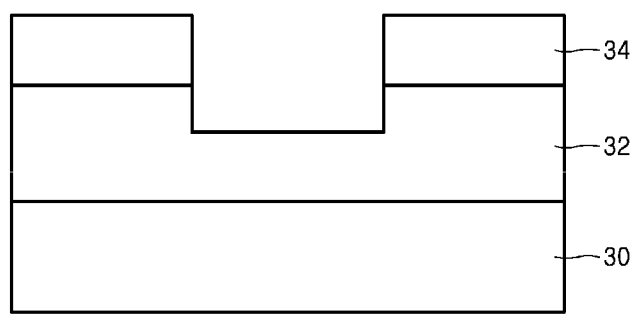

Referring to FIGS. 8 through 10, the exposed portion of the material layer 32 is etched by using the hard mask 34 as an etch mask. As depicted in FIG. 9, the etching may be continued until the substrate 30 is exposed, or, as depicted in FIG. 10, the etching may be continued until a certain thickness of the material layer 32 is etched. FIG. 9 may indicate a case in which a circular shape through hole or a non-circular shape (for example, a line shape) through hole is formed. FIG. 10 may indicate a case in which a groove having a predetermined or given depth is formed in the material layer 32. When the material layer 32 includes a plurality of layers, some of the plurality of layers may be etched.

Carbons included in the hard mask according to example embodiments have double bonds. The binding energy of carbons having double bonds is greater than that of carbons that have single bonds. For example, the binding energy of carbons having single bonds is in a range from about 347 kJ/mol to about 356 kJ/mol. However, the binding energy of carbons having double bonds is in a range from about 611 kJ/mol to about 632 kJ/mol. Accordingly, the etch resistance of the hard mask according to example embodiments may be greater than that of a hard mask formed of carbons having single bonds. That is, the etch selectivity of the hard mask according to example embodiments may be greater than that of a hard mask of the related art. Therefore, when the hard mask according to example embodiments is used, a desired type of pattern may be correctly transferred to a structure or a material layer that has a relatively large aspect ratio and is to be etched, and thus, a desired pattern may be formed.

Also, if the content of hydrogen and oxygen is lower, and the density of a hard mask is higher, the etch resistance of the hard mask increases. The hard mask according to example embodiments has a higher density and lesser content of hydrogen and oxygen than that of a hard mask, for example, an ACL of the related art. Accordingly, the etch resistance of the hard mask according to example embodiments is higher than the hard mask of the related art, and as a result, the etch selectivity of the hard mask according to example embodiments is higher than that of the hard mask of the related art.

While one or more example embodiments have been described with reference to the figures, it will be understood by those of ordinary skill in the art that various changes in form and details may be made therein without departing from the spirit and scope as defined by the following claims.

What is claimed is:

1. A hard mask comprising hydrogen, oxygen and a two-dimensional (2D) material layer having a layered crystalline structure.

2. The hard mask of claim 1, wherein a content of the oxygen is about 4 atomic % or less.

3. The hard mask of claim 1, wherein a density of the hard mask is in a range from about 2.0 g/cm$^3$ to about 2.2 g/cm$^3$.

4. The hard mask of claim 1, wherein a content of the hydrogen is about 10 atomic % or less.

5. The hard mask of claim 1, wherein the 2D material layer has one of a carbon structure and a non-carbon structure.

6. The hard mask of claim 5, wherein the 2D material layer is the carbon structure, the carbon structure including a plurality of graphene sheets.

7. The hard mask of claim 1, wherein the 2D material layer is a carbon-containing material layer having a higher sp2 carbon ratio than an sp carbon ratio.

8. The hard mask of claim 1, wherein the 2D material layer further comprises a doped impurity.

* * * * *